United States Patent
Hefelfinger et al.

(10) Patent No.: US 10,570,937 B2
(45) Date of Patent: Feb. 25, 2020

(54) CLAMP SENSOR SYSTEMS AND METHODS

(71) Applicant: Sensorlink Corporation, Ferndale, WA (US)

(72) Inventors: Kelly R. Hefelfinger, Vancouver (CA); Robert Pendergrass, Sedro Woolley, WA (US); Nathanial Roth, Sedro Woolley, WA (US)

(73) Assignee: SENSORLINK CORPORATION, Ferndale, WA (US)

( * ) Notice: Subject to any disclaimer, the term of this patent is extended or adjusted under 35 U.S.C. 154(b) by 304 days.

(21) Appl. No.: 15/402,959

(22) Filed: Jan. 10, 2017

(65) Prior Publication Data

US 2018/0195539 A1   Jul. 12, 2018

(51) Int. Cl.
| | |
|---|---|
| *F16B 2/06* | (2006.01) |
| *G01R 1/22* | (2006.01) |
| *F16B 2/12* | (2006.01) |
| *F16B 21/06* | (2006.01) |
| *H01R 4/2483* | (2018.01) |

(52) U.S. Cl.
CPC ............. *F16B 2/065* (2013.01); *F16B 2/12* (2013.01); *F16B 21/065* (2013.01); *G01R 1/22* (2013.01); *H01R 4/2483* (2013.01)

(58) Field of Classification Search
CPC .......... F16B 2/065; F16B 2/12; F16B 21/065; G01R 1/22; H01R 4/2483; B25B 5/067; B25B 5/082; B25B 5/125; B25B 13/32
See application file for complete search history.

(56) References Cited

U.S. PATENT DOCUMENTS

| | | | |
|---|---|---|---|
| 3,253,215 A | 5/1966 | Moakler et al. | |
| 3,386,032 A | 5/1968 | Medlar | |

(Continued)

FOREIGN PATENT DOCUMENTS

| | | |
|---|---|---|
| AT | 385154 B | 2/1988 |
| EP | 0067917 A1 | 12/1982 |

(Continued)

OTHER PUBLICATIONS

Novel Pierre FR2511813A1. Feb. 1983. Machine Translation of "Constant torque screw-tighenting electrical cable connector—has clutch arrangement of meshing teeth to transmit tightening force to cable jaws until predetermined force is reached".*

(Continued)

*Primary Examiner* — David P Bryant
*Assistant Examiner* — Nirvana Deonauth
(74) *Attorney, Agent, or Firm* — Michael R. Schacht; Schacht Law Office, Inc.

(57) ABSTRACT

A clamp assembly comprises a base housing, an anchor member, at least one bracing member, an engaging member, and a clamp bolt. The anchor member supports the at least one brace member. The clamp bolt engages a threaded bore in the anchor member. When the at least one brace member is in an extended position, at least one set of brace teeth engages at least one set of base teeth to brace the at least one brace member against the base housing. When the at least one brace member is braced against the base housing, axial rotation of the clamp bolt applies a clamp force on the engaging member to clamp the cable between the engaging member and the base housing.

23 Claims, 16 Drawing Sheets

(56) References Cited

U.S. PATENT DOCUMENTS

| | | | |
|---|---|---|---|
| 3,803,536 A | * | 4/1974 | Becker .................... H01R 4/42 |
| | | | 439/792 |
| 4,258,348 A | | 3/1981 | Belfer et al. |
| 4,456,873 A | | 6/1984 | Schweitzer |
| 4,620,151 A | | 10/1986 | Landre |
| 4,684,196 A | | 8/1987 | Smith et al. |
| 4,717,872 A | | 1/1988 | Wagner et al. |
| 4,839,600 A | | 6/1989 | Kuurstra |
| 5,015,198 A | | 5/1991 | Delin |
| 5,206,777 A | | 4/1993 | Clarey et al. |
| 5,426,360 A | | 6/1995 | Maraio et al. |
| 6,624,622 B2 | | 9/2003 | Noh |
| 6,825,650 B1 | | 11/2004 | McCormack et al. |
| 7,412,338 B2 | | 8/2008 | Wynans et al. |
| 7,940,039 B2 | | 5/2011 | Buda |
| 8,744,788 B2 | | 6/2014 | Sala |
| 9,500,684 B1 | | 11/2016 | Pendergrass et al. |
| 2016/0020529 A1 | * | 1/2016 | Martin ................. H01R 4/2408 |
| | | | 439/391 |

FOREIGN PATENT DOCUMENTS

| | | | | |
|---|---|---|---|---|
| EP | 0282116 A1 | | 9/1988 | |
| EP | 3355069 A1 | | 8/2018 | |
| FR | 2511813 A1 | * | 2/1983 | ............. H01R 11/14 |
| GB | 1396645 A | | 6/1975 | |
| GB | 1554103 A | | 10/1979 | |
| JP | 9029533 A | | 4/1997 | |

OTHER PUBLICATIONS

European Patent Office, "Extended European Search Report", Application No. 18151104.9, dated Jun. 27, 2018, 6 pages.

* cited by examiner

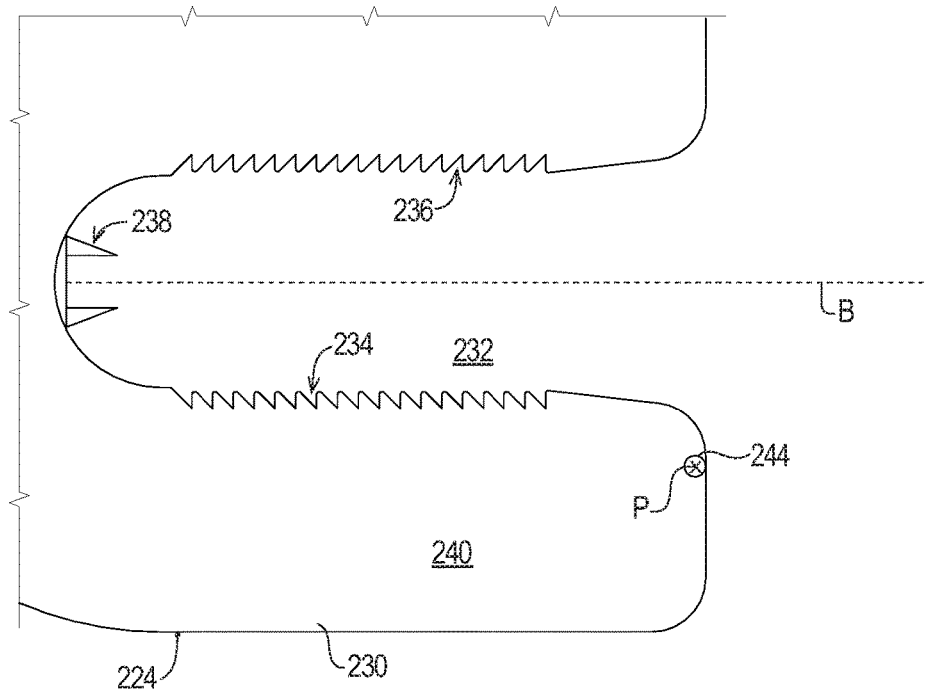
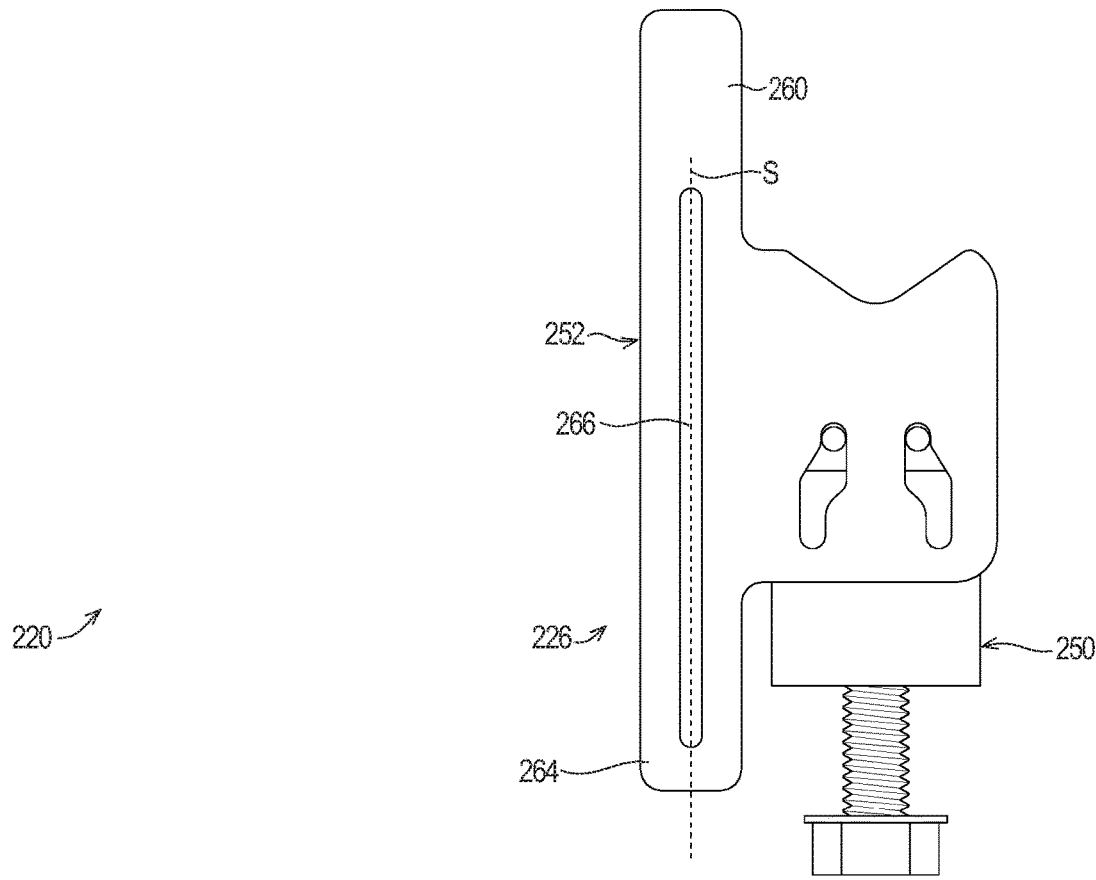
FIG. 11

2

CLAMP SENSOR SYSTEMS AND METHODS

TECHNICAL FIELD

The present invention relates to energy measurement systems and methods and, in particular, to systems and methods that facilitate the measurement of parameters and recording of data associated with power distribution systems.

BACKGROUND

Utility companies operate power distribution systems formed by networks of power distribution equipment connected by power lines. The power distribution equipment and power lines are often located in remote locations. Remote sensing systems and methods are used to sense parameters of the power distribution equipment and power lines so that the operation of the power distribution system may be monitored and optimized.

One type of remote sensing system employs a clamp to secured sensing equipment relative to a cable. The clamp secures the sensing equipment in place on the cable to allow the sensing equipment to measure operating parameters such as voltage and current associated with the cable.

The need exists for improved sensor clamp systems and methods for securing sensor equipment relative to a cable.

SUMMARY

The present invention may be embodied as a clamp assembly for use with a cable of an electrical distribution system. The example clamp assembly comprises a base housing, an anchor member, at least one bracing member, an engaging member, and a clamp bolt. The base housing defines at least one set of base teeth and a base axis. The anchor member defines a threaded bore. The anchor member is supported for movement relative to along the base axis. The at least one brace member defines at least one set of brace teeth. The anchor member supports the at least one brace member for movement along a direction lateral to the base axis. The clamp bolt engages the threaded bore. When the at least one brace member is in an extended position, the at least one set of brace teeth engages the at least one set of base teeth to brace the at least one brace member against the base housing. When the at least one brace member is braced against the base housing, axial rotation of the clamp bolt applies a clamp force on the engaging member to clamp the cable between the engaging member and the base housing.

The present invention may also be embodied as a method of clamping a base housing to a cable of an electrical distribution system comprising the following steps. The base housing is formed to define at least one set of base teeth and a base axis. The anchor member defines a threaded bore. The anchor member is supported for movement relative to along the base axis. At least one brace member defining at least one set of brace teeth is provided. The at least one brace member is supported relative to the anchor member for movement along a direction lateral to the base axis. A clamp bolt is engaged with the threaded bore. The at least one brace member is arranged in an extended position in which the at least one set of brace teeth engages the at least one set of base teeth to brace the at least one brace member against the base housing. When the at least one brace member is braced against the base housing, the clamp bolt is axially rotated such that the clamp bolt applies a clamp force on the engaging member to clamp the cable between the engaging member and the base housing.

DESCRIPTION OF THE DRAWINGS

FIG. 11 is a top plan view illustrating a second example sensor clamp of the present invention in a disassembled configuration;

DETAILED DESCRIPTION

Figure 1:
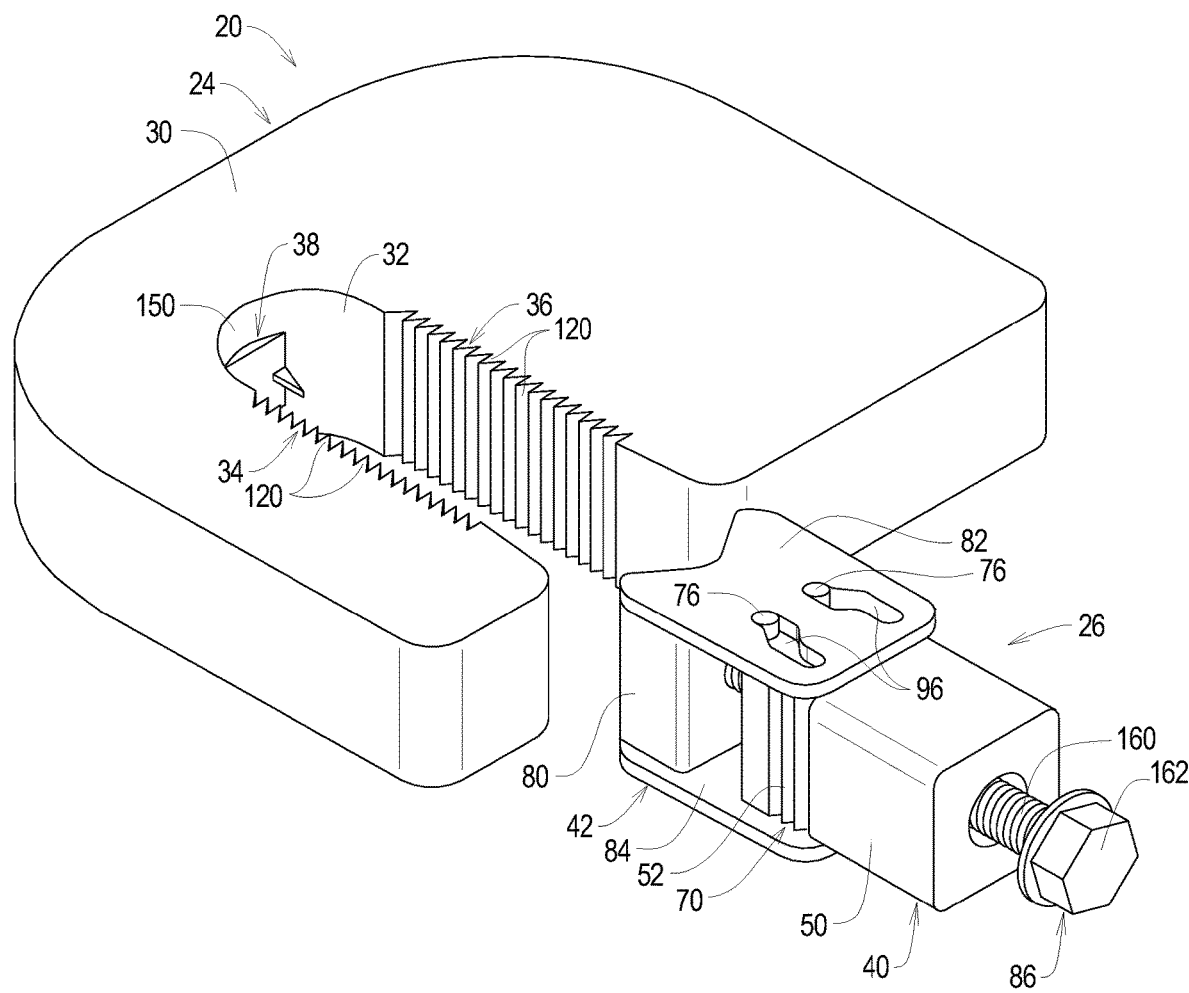
FIG. 1 is perspective view of a first example sensor clamp of the present invention.
Figure 2:
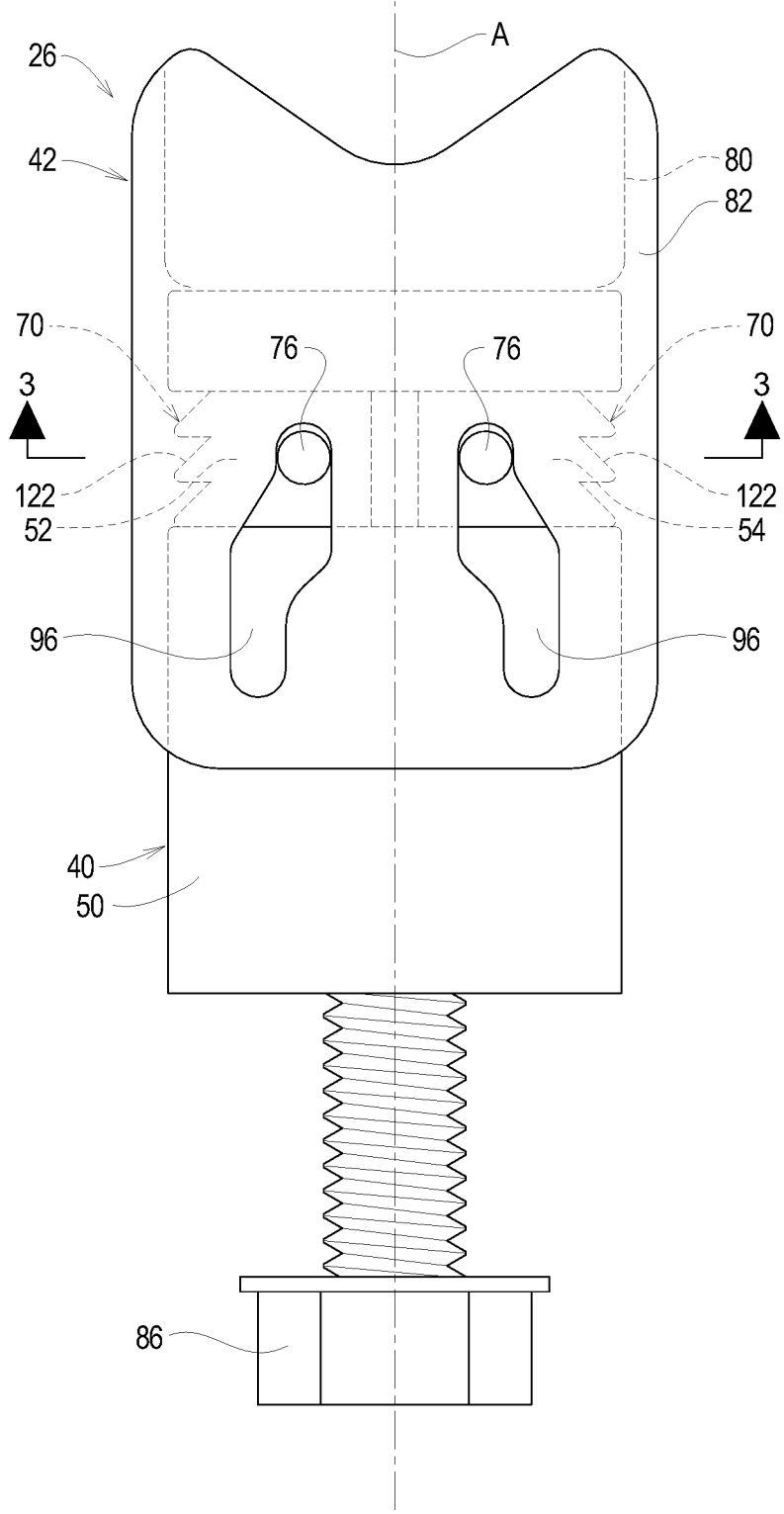
FIG. 2 is a top plan view illustrating a first example carriage assembly of the first example sensor clamp, with the first example carriage assembly being in a compressed configuration.

Referring initially to FIG. 1 of the drawing, depicted therein is an example sensor clamp system 20 constructed in accordance with, and embodying, the principles of the present invention. The example sensor clamp system 20 is configured to clamp onto a cable 22 as shown in FIGS. 7-10.

The example sensor clamp system 20 comprises a base assembly 24 and a carriage assembly 26.

The example base assembly 24 comprises a base housing 30. The example base housing 30 typically, but not necessarily, contains electronics (not shown) and/or wiring (not shown) that physically engages and/or is wirelessly connected to the cable 22 to allow sensing of characteristics associated with the cable 22 such as current and/or voltage. The exact nature of any such electronics, if included, is not relevant to the principles of the present invention.

The example base housing 30 defines a base notch 32 and first and second sets of base teeth 34 and 36. The example first and second sets of base teeth 34 and 36 are formed on or attached to the base housing 30 on either side of the base notch 32. The example base housing 30 further defines a housing axis A that extends between the first and second sets of base teeth 34 and 36.

The example base assembly 24 further optionally comprises a prong member 38 secured relative to the base housing 30 within the base notch 32. The example prong member 38 extends along the base axis A as will be described in further detail below. The optional prong member 38 may be operatively connected to wiring and/or electronics that may be arranged within the base housing 30.

The example carriage assembly 26 comprises an anchor assembly 40 and an engaging assembly 42.

The example anchor assembly 40 comprises an anchor member 50, first and second brace members 52 and 54, and first and second biasing members 56 and 58. The example anchor member 50 defines a threaded bore 60 and first and second brace notches 62 and 64. The example brace members 52 and 54 are the same for manufacturing and assembly purposes but may be different for other embodiments of the present invention. Each of the example brace members 52 and 54 defines brace teeth 70, first and second bias notches 72 and 74, and first and second guide projections 76 and 78.

The example engaging assembly 42 comprises an engaging member 80, first and second guide plates 82 and 84, a clamp bolt 86, and a retaining screw 88. The example engaging member 80 defines a bolt cavity 90, a retainer hole 92, and a retainer collar 94. The first and second guide plates 82 and 84 define first and second guide slots 96 and 98, respectively.

In use, the example carriage assembly 26 is supported within the base notch 32 of the example base assembly 24 for movement towards and away from the prong member 38. Additionally, the first and second brace members 52 and 54 are received within the first and second brace notches 62 and 64, and the biasing members 56 and 58 bias the first and second brace members 52 and 54 relative to the anchor member 50 laterally away from the base axis A. Further, with the carriage assembly 26 arranged within the base notch 32, the sets of brace teeth 70 on the first and second brace members 52 and 54 face the first and second sets of base teeth 34 and 36, respectively.

The example carriage assembly 26 is further reconfigurable between a retracted configuration in which the brace teeth 70 do not engage base teeth 34 and 36 and an extended configuration in which the brace teeth 70 engage the base teeth 34 and 36. In particular, the first and second biasing members 56 and 58 are arranged between the anchor member 50 and the first and second brace members 52 and 54 to bias the first and second brace members 52 and 54 out of the first and second brace notches 62 and 64, respectively, from the retracted configuration and towards the extended configuration.

When the brace teeth 34 and 36 engage the base teeth 70, the position of the anchor member 50 is fixed relative to the base housing 30. With the anchor member 50 fixed relative to the base housing, axial rotation of the clamp bolt 86 forces the engaging member 80 towards the closed end of the base notch 32; in the example sensor clamp system 20, the engaging member 80 is forced towards the prong member 38. As perhaps best shown in FIGS. 8-10, when the clamp bolt 86 is fully tightened, the example prong member 38 penetrates the cable 22 to establish a direct physical connection between the prong member 38 and the interior of the cable 22 (e.g., electric conductors).

The example first and second guide plates 82 and 84 engage the base housing 30 to restrict movement of the carriage assembly 26 to only along the housing axis A.

The guide slots 96 and 98 on the example guide plates 82 and 84 receive the guide projections 76 and 78 on the example brace members 52 and 54 to hold the brace members 52 and 54 in the retracted and extended positions. In particular, the guide slots 96 and 98 are shaped to engage the guide projections 76 and 78 to hold the brace members 52 and 54 in the retracted position while the carriage assembly 26 is inserted into the base notch 32 to form the example sensor clamp system 20.

In particular, the guide slots 96 and 98 engage the guide projections 76 and 78 to space the guide projections 76 and 78 a first distance D1 (FIG. 7) from each other and the first and second guide projections 76 and 78 hold the first and second brace members 52 and 54 in retracted positions corresponding to the retracted configuration. When the carriage assembly 26 is initially inserted into the base notch 32, the first distance D1 between guide projections 76 and 78 holds the brace members 52 and 54 in the retracted positions to allow free movement of the carriage assembly 26 relative to the base assembly 24 along the housing axis A. The retracted positions of the brace members 52 and 54 correspond to the retracted configuration of the carriage assembly 26.

Accordingly, when the carriage assembly 26 is fully inserted into the base notch 32 such that the engaging member 80 engages the cable 22, rotation of the clamp bolt 86 causes the clamp bolt 86 to engage the threaded bore 60 to force the anchor member 50 away from the engaging member 80 along the base axis A. The first and second brace members 52 and 54 are received in the first and second brace notches 62 and 64, respectively, such that forces applied on the anchor member 50 in the direction of the base axis A are rigidly transferred to the first and second brace members 52 and 54.

As the anchor member 50 moves away from the engaging member 80, the anchor member 50 carries the brace members 52 and 54 relative to the guide slots 96 and 98 such that the guide projections 76 and 78 are guided into a position in which the guide projections 76 and 78 are spaced a second distance D2 (FIG. 8) from each other. When the guide projections 76 and 78 are spaced the second distance D2 from each other, the brace members 52 and 54 are in extended positions corresponding to the extended configuration of the carriage assembly 26. As generally described above, the biasing members 56 and 58 apply a biasing force to the brace members 52 and 54 to ensure that the brace members 52 and 54 are held in the extended positions when the guide projections 76 and 78 are spaced the second distance D2 from each other.

The clamp bolt 86 extends into the bolt cavity 90 formed in the engaging member 80. The retaining hole 92 extends through the engaging member 80 and terminates in the bolt cavity 90. The retaining screw 88 extends through the retaining hole 92 and is threaded into the end of the clamp bolt 86. The retaining screw 88 is stopped by the retaining collar 94 from passing through the retaining hole 92 by the retaining collar 94. The retaining screw 88 thus engages the clamp bolt 86 such that the clamp bolt 86 may axially rotate about the system axis A relative to the engaging member 80 but movement of the clamp bolt 86 in both directions along the system axis A causes corresponding movement of the engaging member 80 along the system axis A.

The example base teeth of the first and second sets of base teeth 34 and 36 are formed by base teeth 120, and the sets of brace teeth 70 formed on the brace members 52 and 54 form brace teeth 122. The base teeth 120 and the brace teeth 122 are configured such that the brace teeth 122 positively engage the base teeth 120 when the brace members 52 and 54 are in the extended positions.

In particular, the base teeth 120 define first and second base teeth surfaces 130 and 132, while the brace teeth 122 define first and second brace teeth surfaces 140 and 142. When the carriage assembly 26 is supported by the base assembly 24 and the brace members 52 and 54 are in the extended positions, the first base teeth surfaces 130 engage the first brace teeth surfaces 140 to prevent movement of the carriage assembly 26 away from the closed end 150 defined by the base notch 32. In the example sensor clamp system 20, the first base teeth surfaces 130 and the first brace teeth surfaces 140 are substantially perpendicular to the housing axis A.

The example second base teeth surfaces 132 and second brace teeth surfaces 142 define complementary angles with respect to the housing axis A. When the first and second brace members 52 and 54 move from the retracted positions to the extended positions, the second base teeth surfaces 132 engage the second brace teeth surfaces 142 to guide the first base teeth surfaces 130 into contact with the first brace teeth surfaces 140. While the engagement of the second base teeth surfaces 132 engage the second brace teeth surfaces 142 to inhibit movement of the carriage assembly 26 towards from the closed end 150 of the base notch 32, the complementary angles of the surfaces 132 and 142 allow the brace teeth 122 to move up and over the base teeth 120 against the force of the biasing members 56 and 58 and towards the retracted position. The brace teeth 122 and base teeth 120 in combination with the biasing members 56 and 58 thus establish a ratchet action that allows the carriage assembly 26 to be moved towards the closed end 150 of the notch 32 by deliberate application of force but substantially prevents movement of the carriage assembly 26 away from the closed end 150 of the notch 32 when a load is applied on the carriage assembly 26 by the clamp bolt 86.

Figure 3:
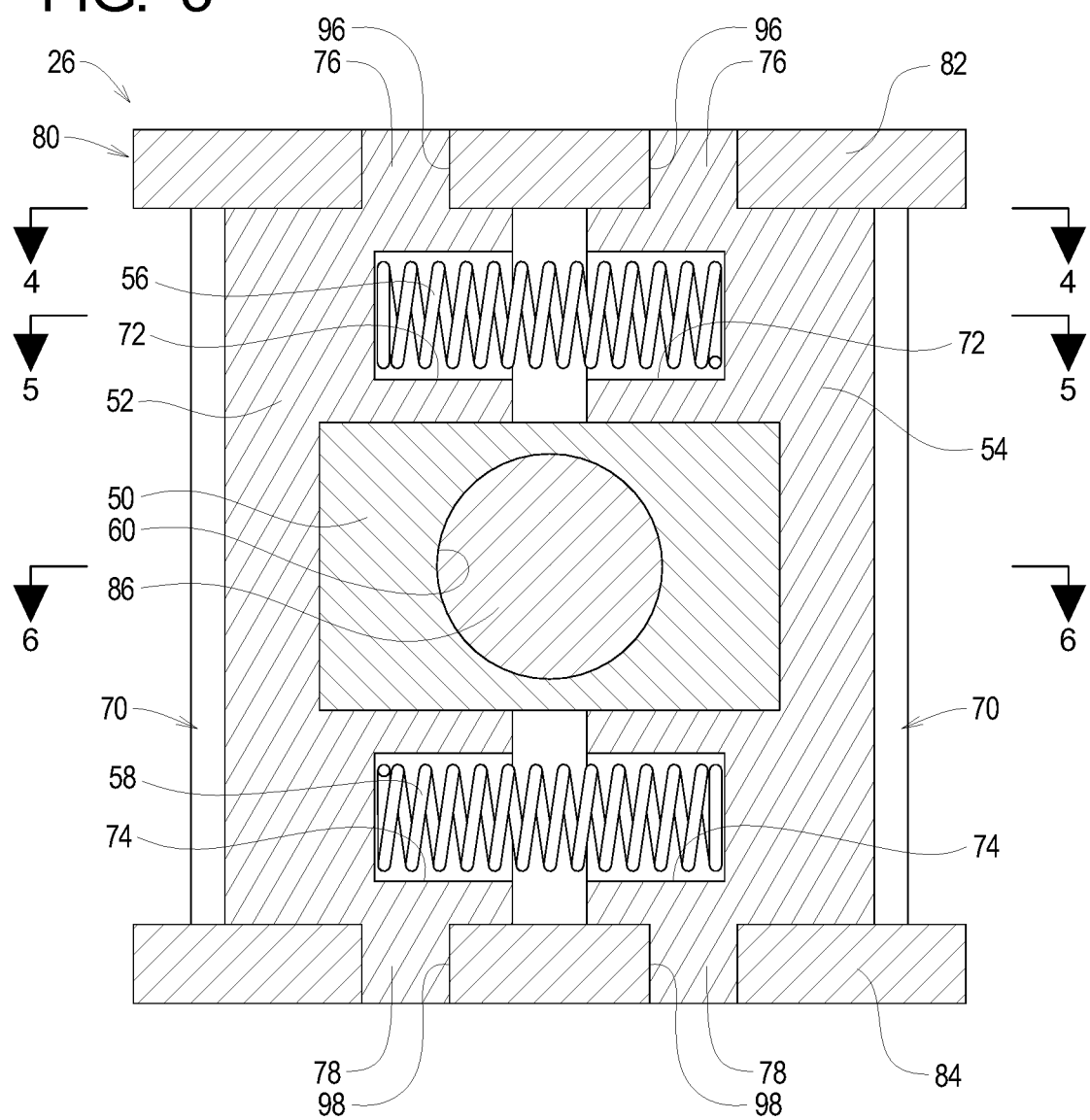
FIG. 3 is a section view taken along lines 3-3 in FIG. 2, with the first example carriage assembly being in the retracted configuration.
Figure 4:
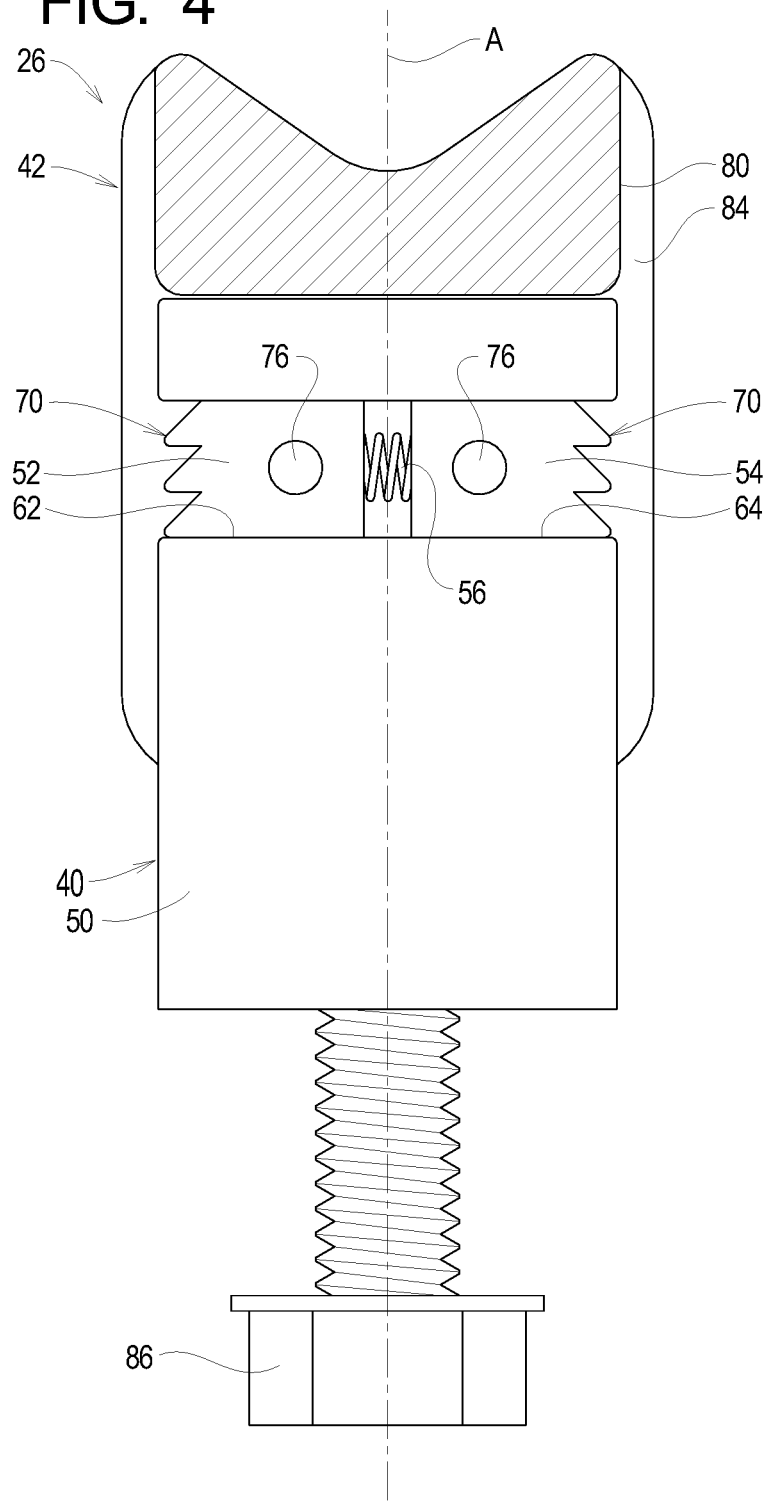
FIG. 4 is a section view taken along lines 4-4 in FIG. 3, with the first example carriage assembly being in the retracted configuration.
Figure 5:
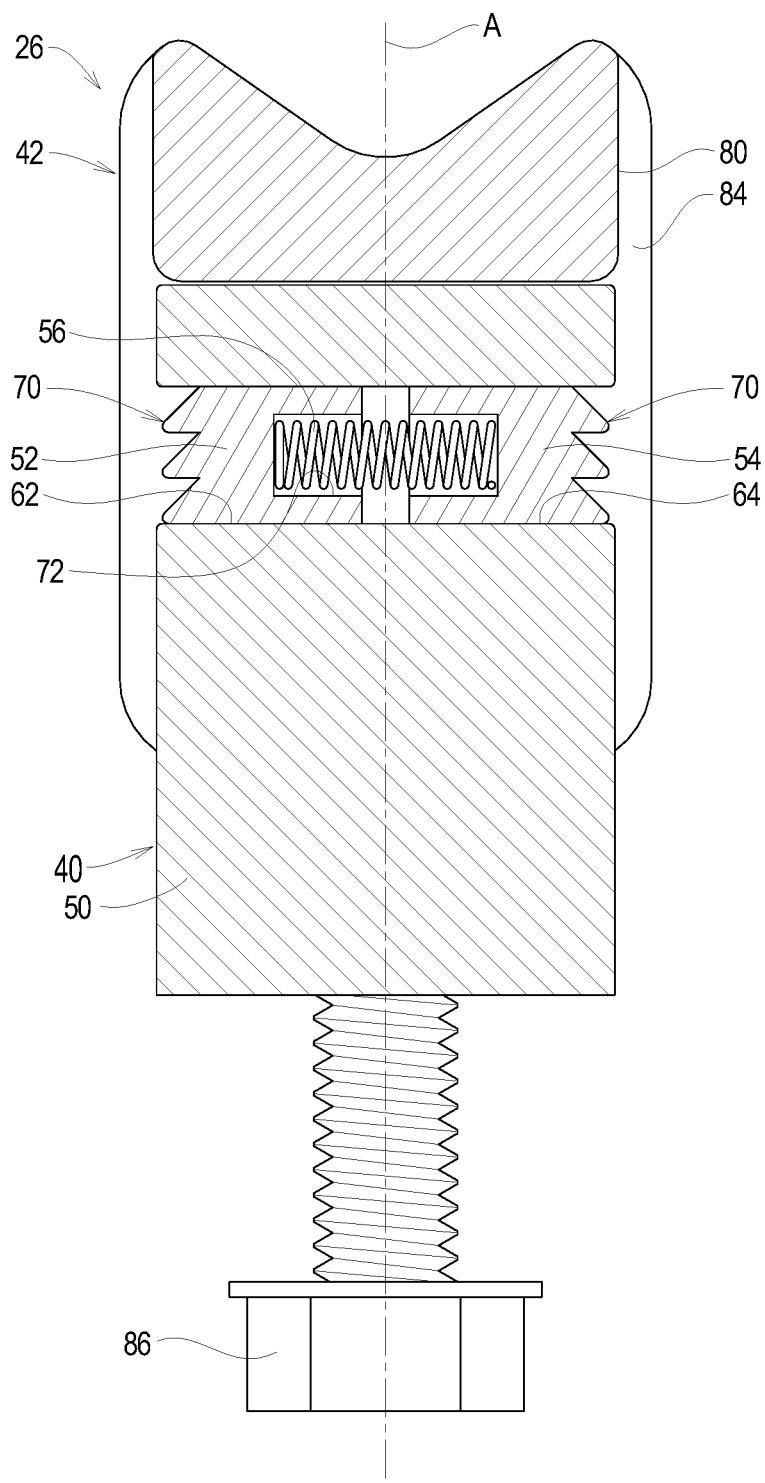
FIG. 5 is a section view taken along lines 5-5 in FIG. 3, with the first example carriage assembly being in the retracted configuration.
Figure 6:
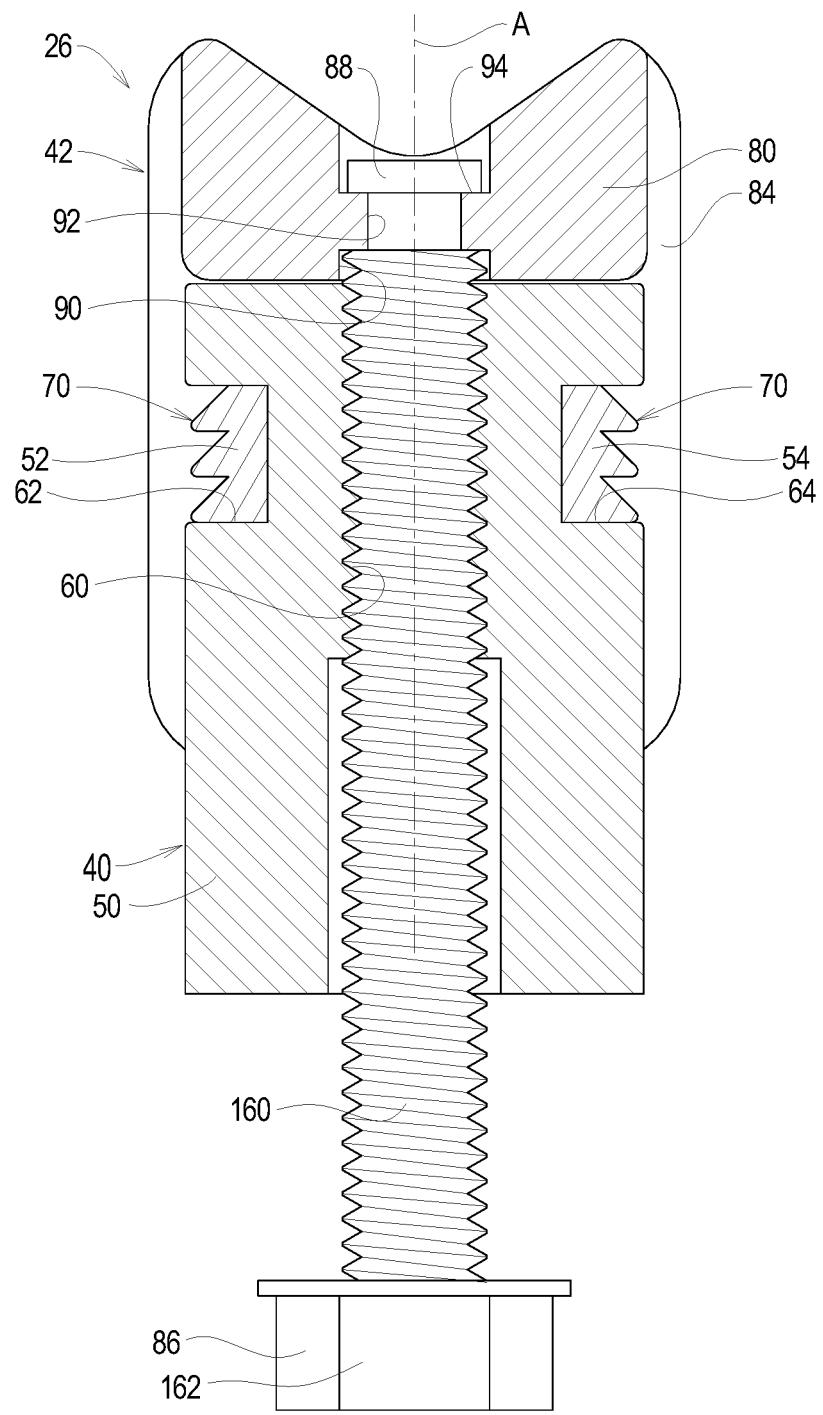
FIG. 6 is a section view taken along lines 6-6 in FIG. 3, with the first example carriage assembly being in the retracted configuration.
Figure 7:
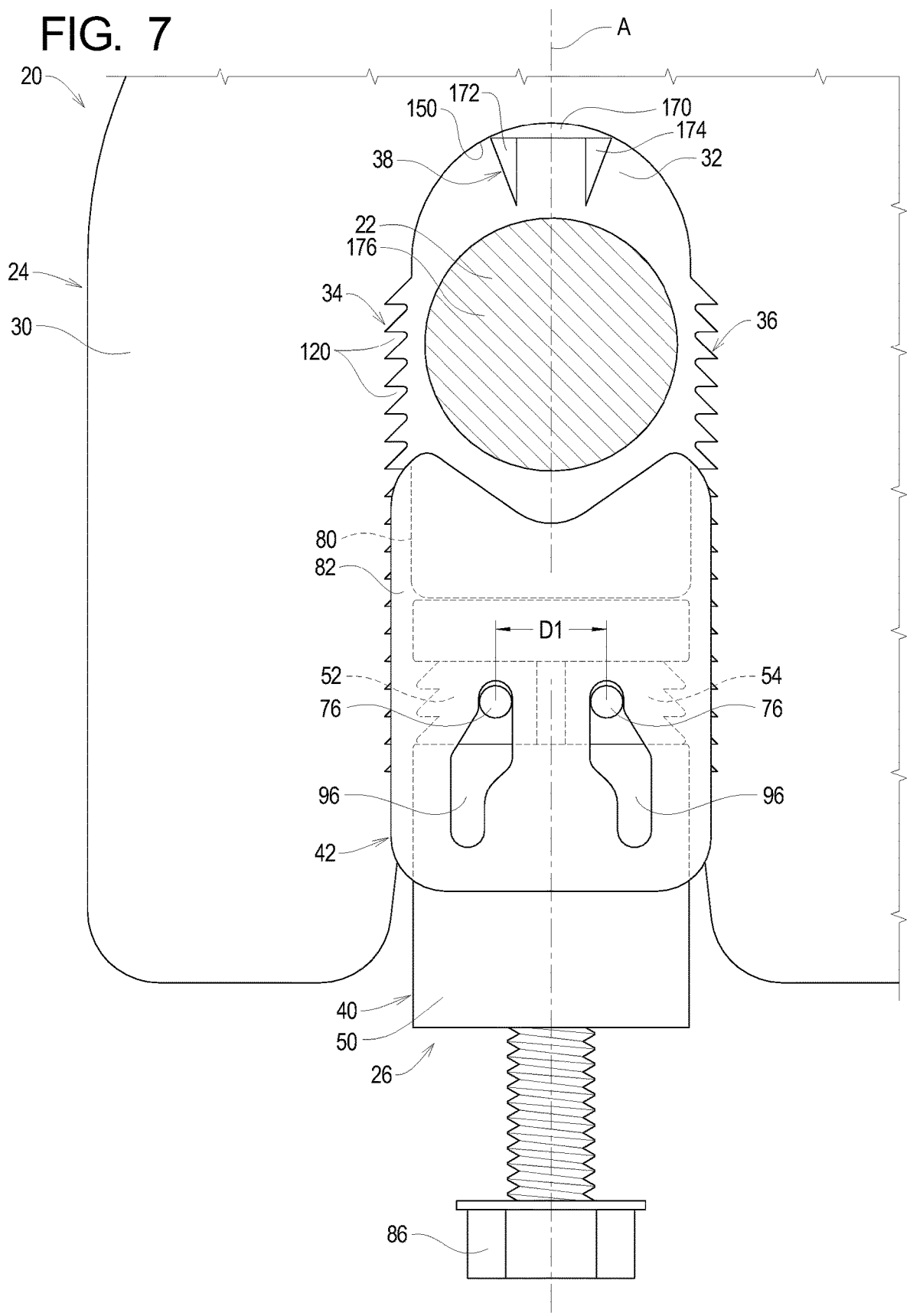
FIG. 7 is a top plan partial section view similar to FIG. 4 illustrating the process of attaching the first example sensor clamp to a cable with the first example carriage assembly in a retracted configuration.
Figure 8:
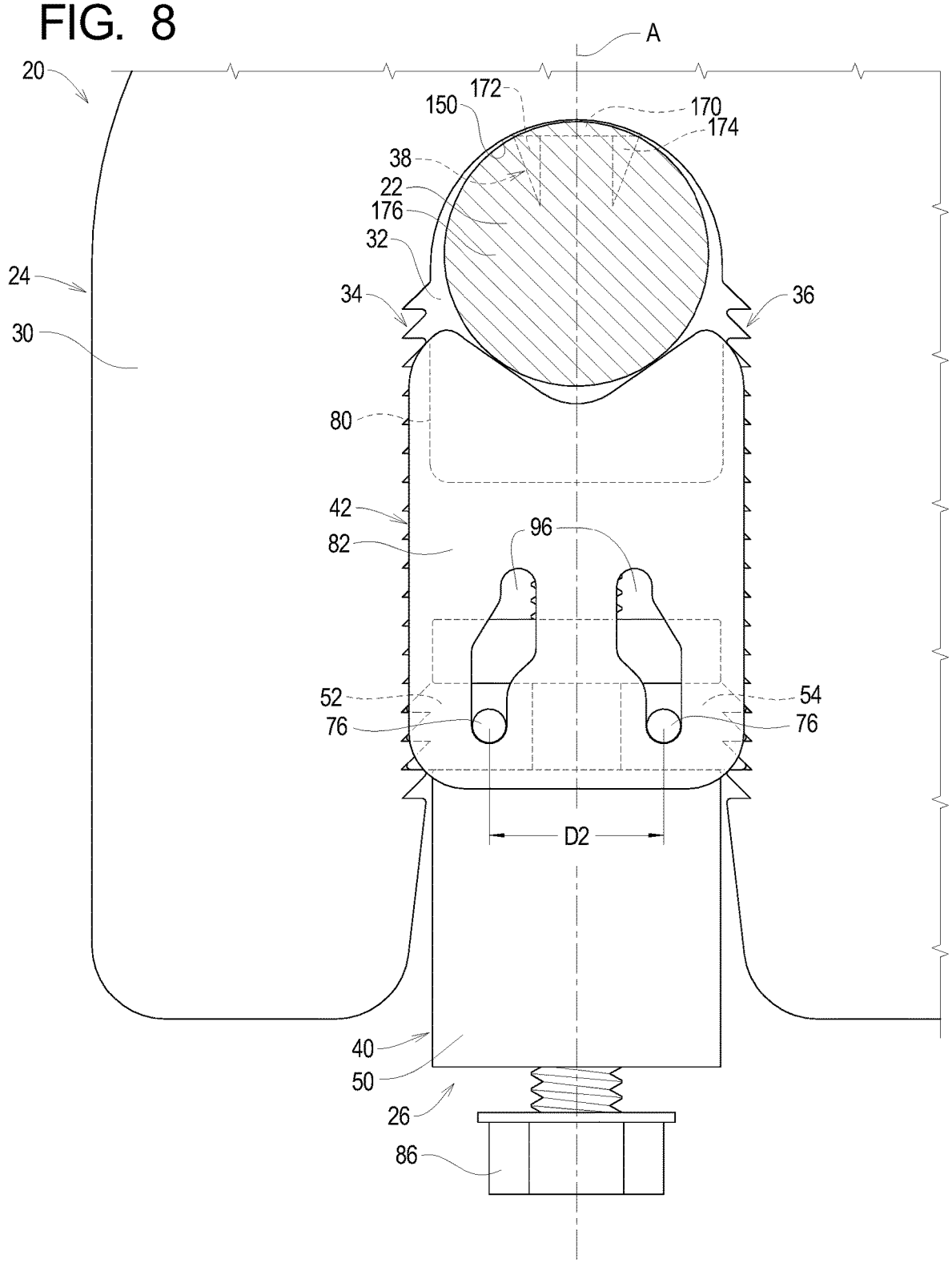
FIG. 8 is a top plan partial section view similar to FIG. 7 illustrating the first example sensor clamp attached to the cable with the first example carriage assembly in an extended configuration.
Figure 9:
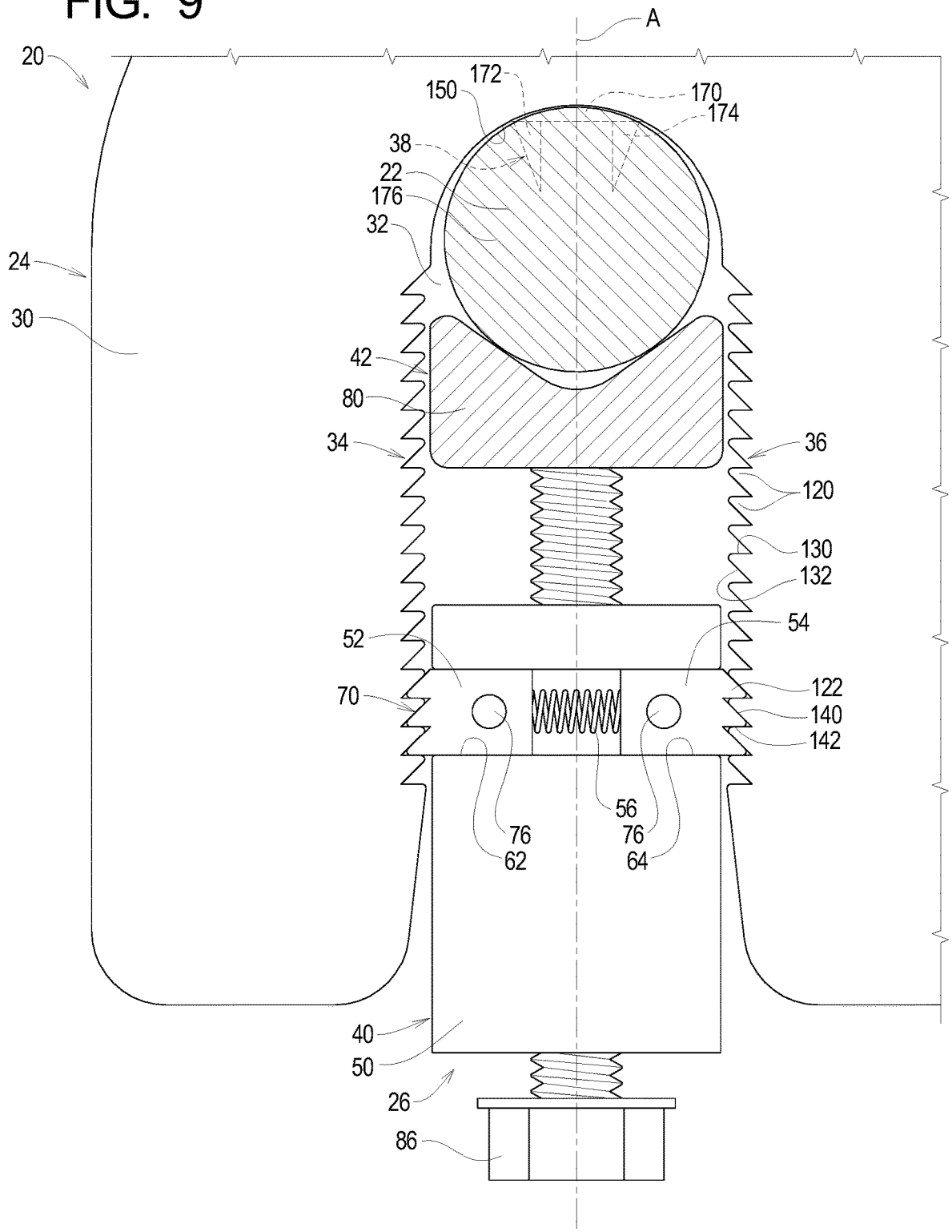
FIG. 9 is a top plan partial section view similar to FIG. 4 illustrating the first example sensor clamp attached to the cable with the first example carriage assembly in the extended configuration.
Figure 10:
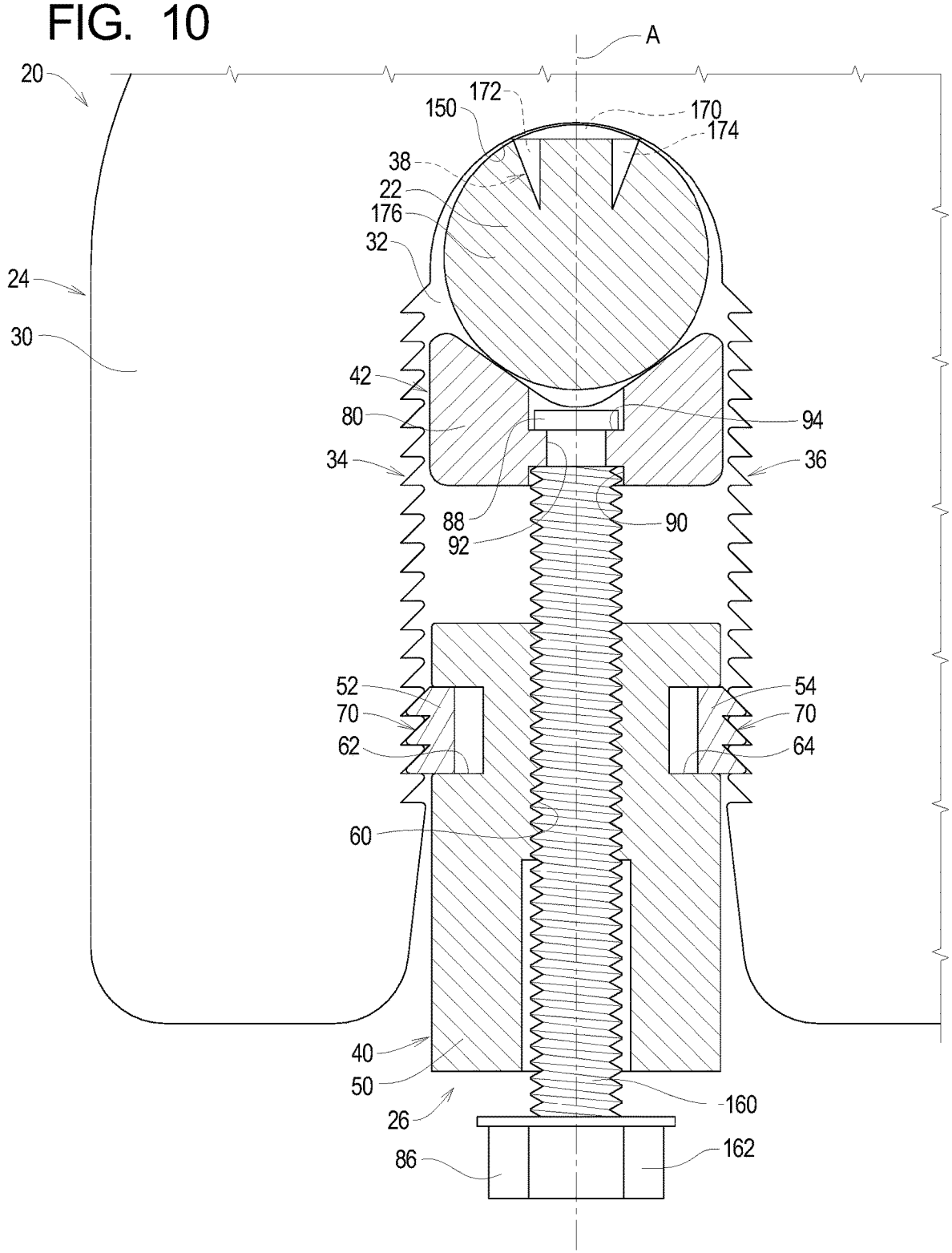
FIG. 10 is a top plan partial section view similar to FIG. 6 illustrating the first example sensor clamp attached to the cable with the first example carriage assembly in the extended configuration.

The example biasing members 56 and 58 are compression springs. The ends of the biasing member 56 are arranged within the first bias notches 72, and the ends of the biasing member 58 are arranged within the second bias notch 74 (FIG. 3). The biasing members 56 and 58 thus force the brace members 52 and 54 away from each other from the retracted positions and towards the extended positions. Biasing structures other than compression springs may be used in addition or instead. For example, one or more resilient tabs may be integrally formed on one or both of the first and second brace members 52 and 54 that apply biasing forces similar to those created by the compression springs forming the example biasing members 56 and 58.

The example clamp bolt 86 defines a shaft 160 and a head 162. The example shaft 160 is at least partly threaded to match the threaded bore 60. The example head 162 is a standard hex-shape to facilitate axial rotation of the clamp bolt 86 using a wrench. The head 162 also forms a clamping surface capable of forcing the anchor member 50 towards the closed end 150 of the base notch 32 when the clamp bolt 86 is axially rotated.

The example prong member 38 is a metal part defining a seat portion 170 and first and second point portions 172 and 174. The example seat portion 160 is rigidly attached to the closed end 150 of the base notch 32 such that the point portions 172 and 174 extend on either side of and substantially along the base axis A. When the engaging member 80 engages the cable 22, axial rotation of the clamp bolt 86 applies a clamping force on the engaging member 80 while the brace members 52 and 54 engage the base housing to brace the anchor member 50. This clamping force will initially force the point portions 172 and 174 into the cable 22 such that the point portions 172 and 174 come into contact with metal conductors 176 within the cable 22. The example seat portion 170 is also connected to sensor cables capable of carrying an electrical signal from the metal conductors 176 to electronics capable of measuring that signal.

The exact sizes, shapes, and configurations of the various components are not critical to any specific implementation of the principles of the present invention. The sizes, shapes, and configurations of the components forming the example sensor clamp system 20 define complementary surfaces that facilitate smooth movement of the anchor member 50 relative to the base housing 30, the brace members 52 and 54 relative to the anchor member 50, the guide plates 82 and 84 relative to the base housing 30. The example guide plates 82 and 84 are detachably attached to the engaging member 80 to facilitate assembly of the example sensor clamp system 20.

Turning now to FIGS. 11-16, depicted therein is a second example sensor clamp system 220 constructed in accordance with, and embodying, the principles of the present invention. The example sensor clamp system 220 is configured to clamp onto a cable 222 as shown in FIGS. 13-16.

The example sensor clamp system 220 comprises a base assembly 224 and a carriage assembly 226.

The example base assembly 224 comprises a base housing 230. The example base housing 230 typically, but not necessarily, contains electronics (not shown) and/or wiring (not shown) that physically engages and/or is wirelessly connected to the cable 222 to allow sensing of characteristics associated with the cable 222 such as current and/or voltage. The exact nature of any such electronics, if included, is not relevant to the principles of the present invention. The example base housing 230 is or may be similar to the example base housing 30 described above. The example base housing 230 will thus be described herein primarily to the extent that it differs from the example base housing 30 described above.

Like the example base housing 30, the example base housing 230 defines a base notch 232 and first and second sets of base teeth 234 and 236 formed on or attached to the base housing 230 on either side of the base notch 232. The example base housing 230 further defines a housing axis B that extends between the first and second sets of base teeth 234 and 236. The example base assembly 224 further optionally comprises a prong member 238 secured relative to the base housing 230 within the base notch 232. The example prong member 238 is or may be similar to the prong member 238 described above and may be operatively connected to wiring and/or electronics that may be arranged within the base housing 230.

The example base assembly 224 defines first and second housing surfaces 240 and 242. First and second plate projections 244 and 246 extend in opposite directions from the first and second housing surfaces 240 and 242, respectively, of the example base assembly 224. The example first and second plate projections 244 and 246 are further aligned along a plate projection axis P. The example plate projection axis P is substantially orthogonal to, and spaced from, the base axis B.

The example carriage assembly 226 comprises an anchor assembly 250 and an engaging assembly 252. The example anchor assembly 252 defines first and second sets of brace teeth 254, with only the first set of the brace teeth 254 visible in FIG. 12. The example anchor assembly 250 and engaging assembly 252 are or may be similar to the example anchor assembly 40 and engaging assembly 42 described above. The example anchor assembly 250 and engaging assembly 252 further interact in a manner that is similar to that of the example anchor assembly 40 and engaging assembly 42 described above. The example anchor assembly 250 and engaging assembly 252 will thus be described herein primarily to the extent that they differ from the example anchor assembly 40 and example engaging assembly 42 described above.

The example engaging assembly 252 comprises first and second guide plates 260 and 262. The example guide plates 260 and 262 each define a slot portion 264 defining a channel slot 266. The example guide plates 260 and 262 are spaced from each other such that the slot portions 264 define a first spacing distance D1. The example first spacing distance D1 is predetermined to be substantially the same as a second spacing distance D2 between the example first and second housing surfaces 240 and 242. The channel slots 266 each define slot axis S; the example slot axes S are parallel to each other during normal operation of the example sensor clamp 220.

Figure 12:
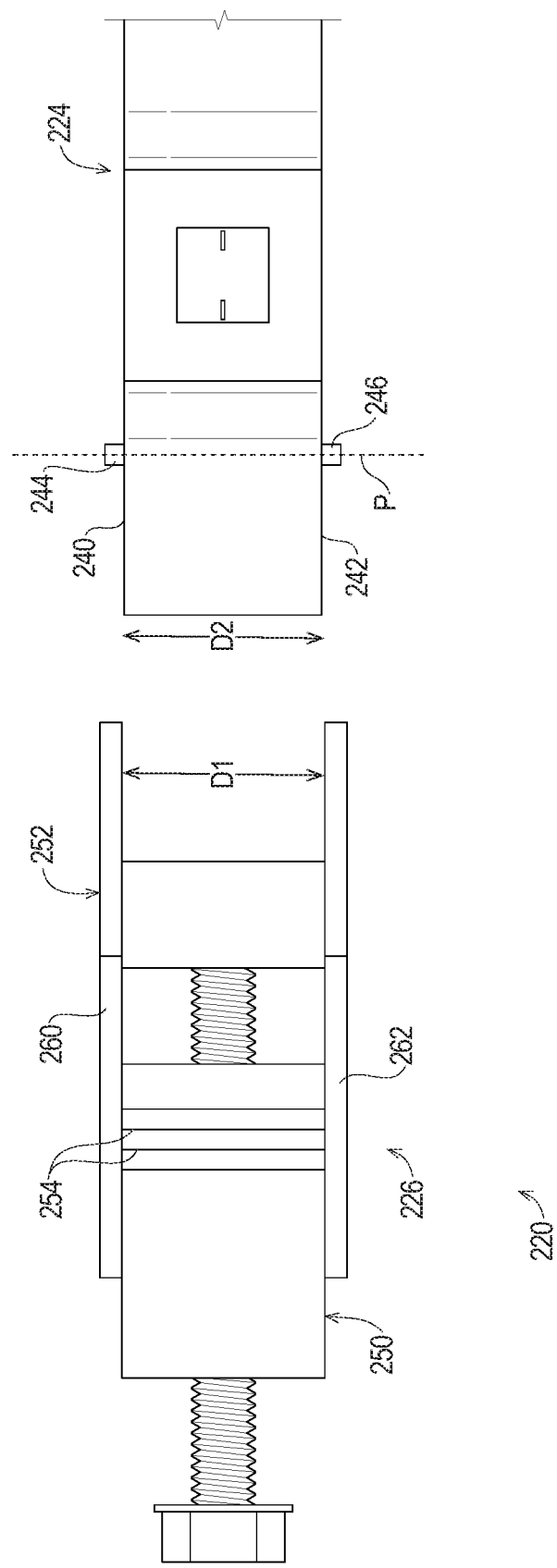
FIG. 12 is a front elevation view illustrating the second example sensor clamp in the disassembled configuration.
Figure 13:
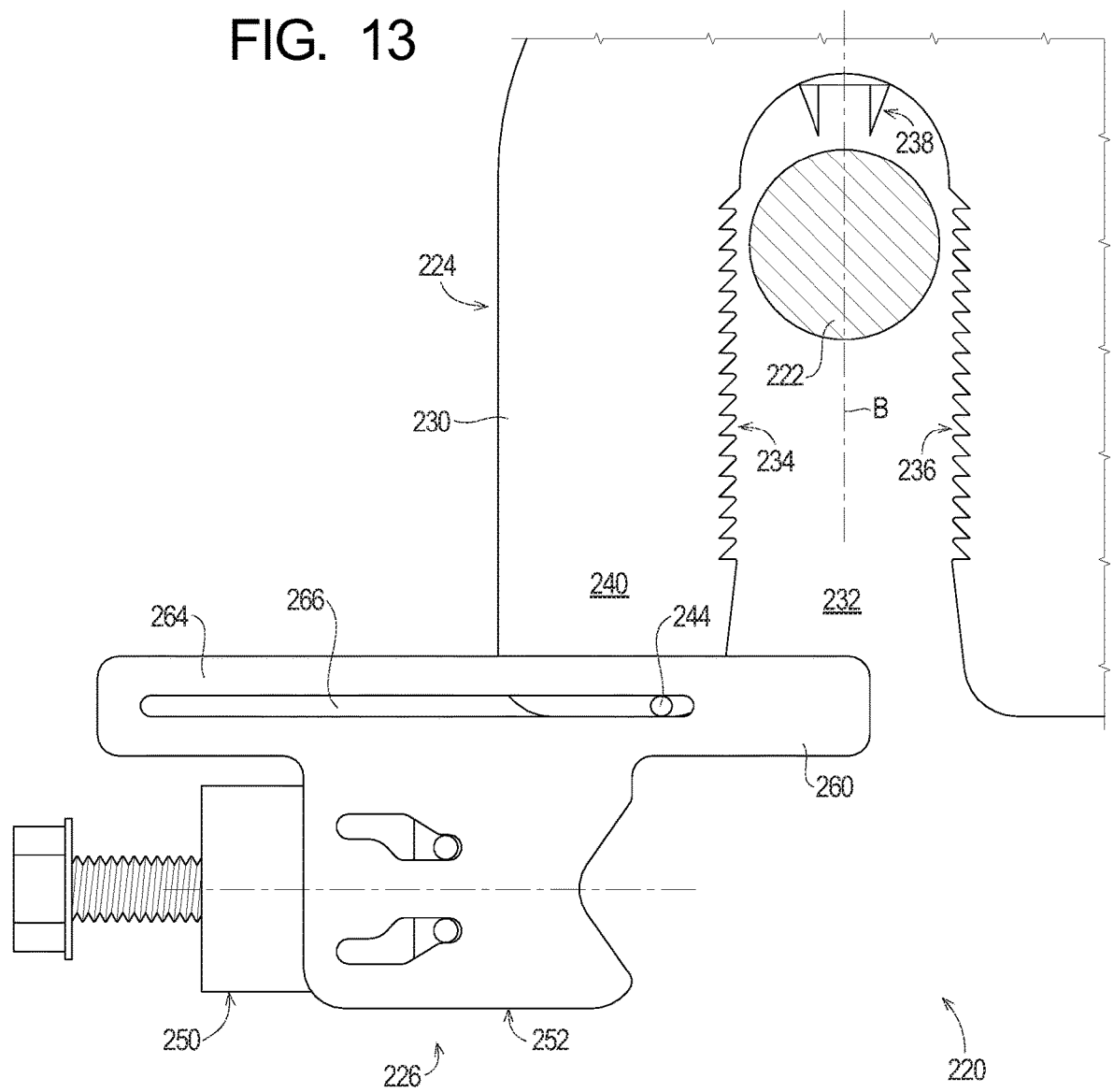
FIG. 13 is a a is a top plan view illustrating the second example sensor clamp of the present invention in an assembled, open configuration.
Figure 14:
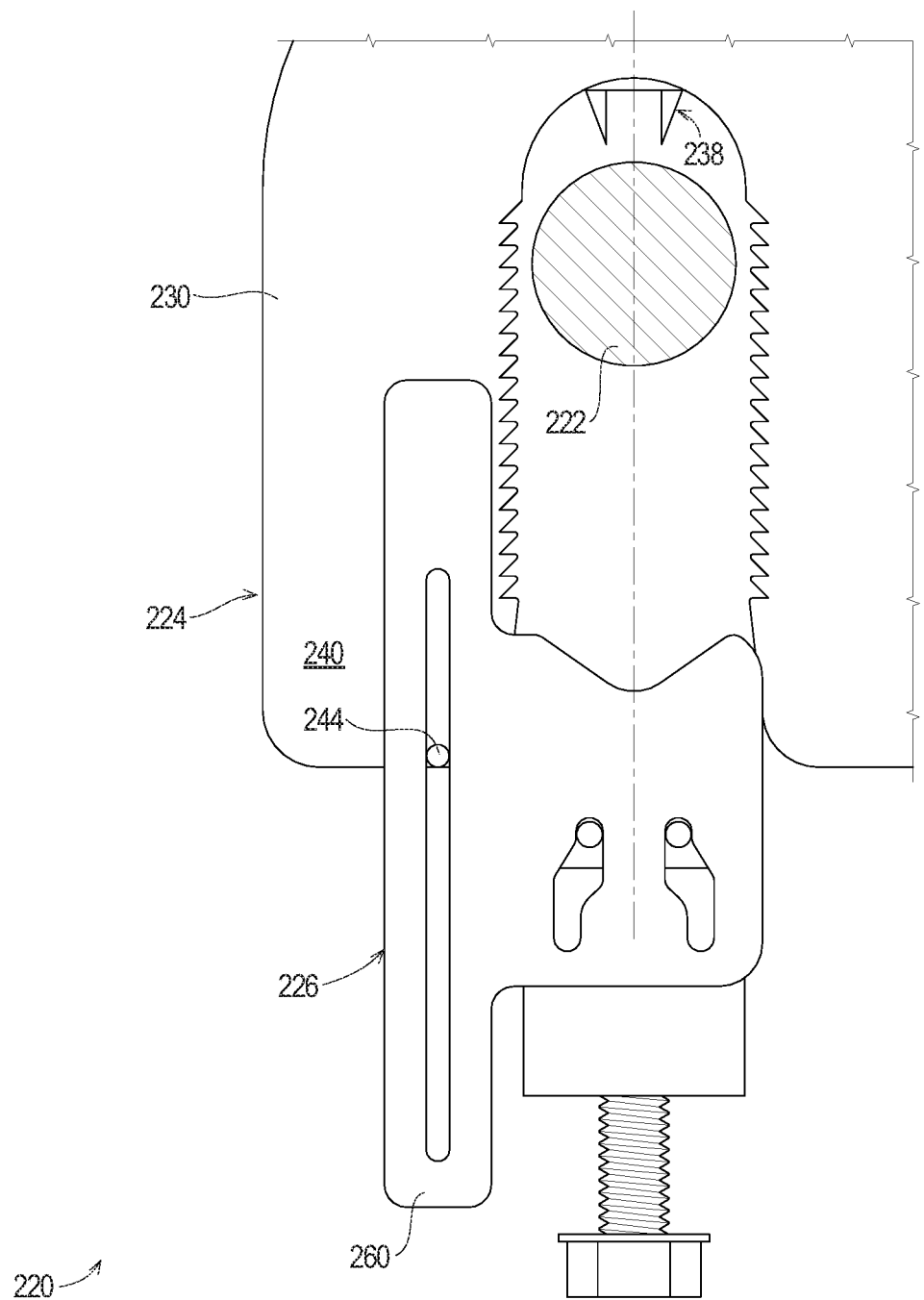
FIG. 14 is a a is a top plan view illustrating the second example sensor clamp of the present invention in an assembled, closed configuration.
Figure 15:
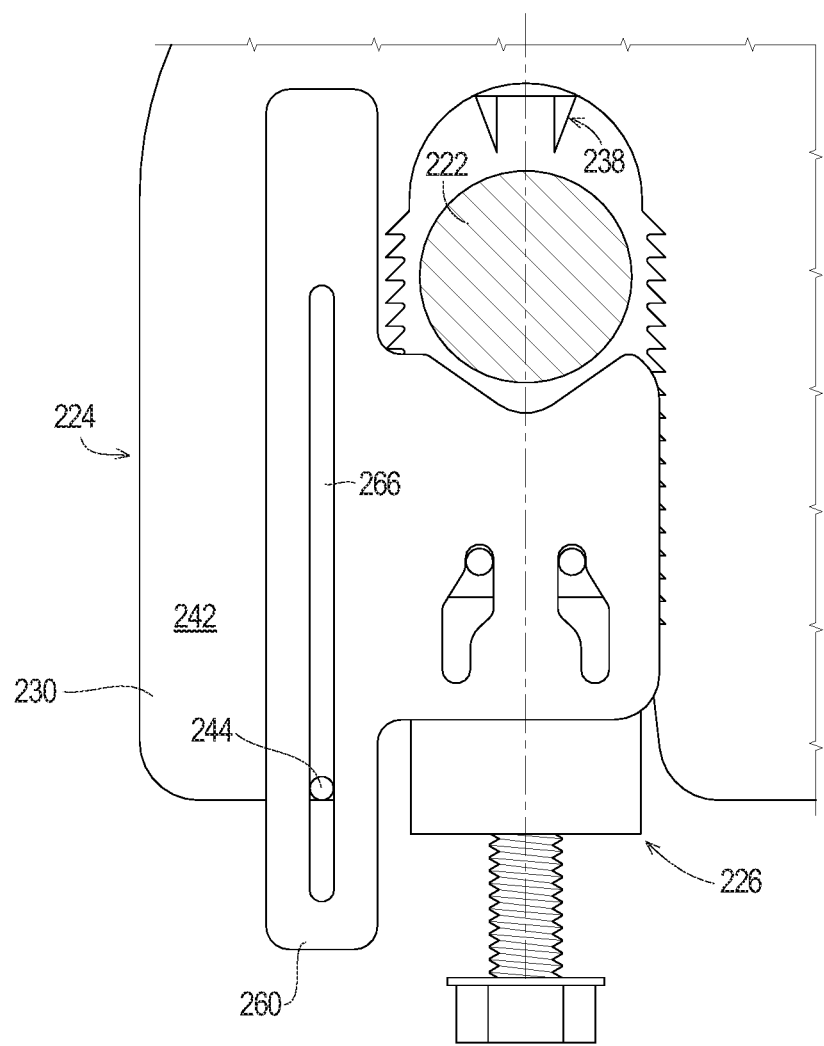
FIG. 15 is a a is a top plan view illustrating the second example sensor clamp of the present invention in an assembled, pre-clamped configuration.
Figure 16:
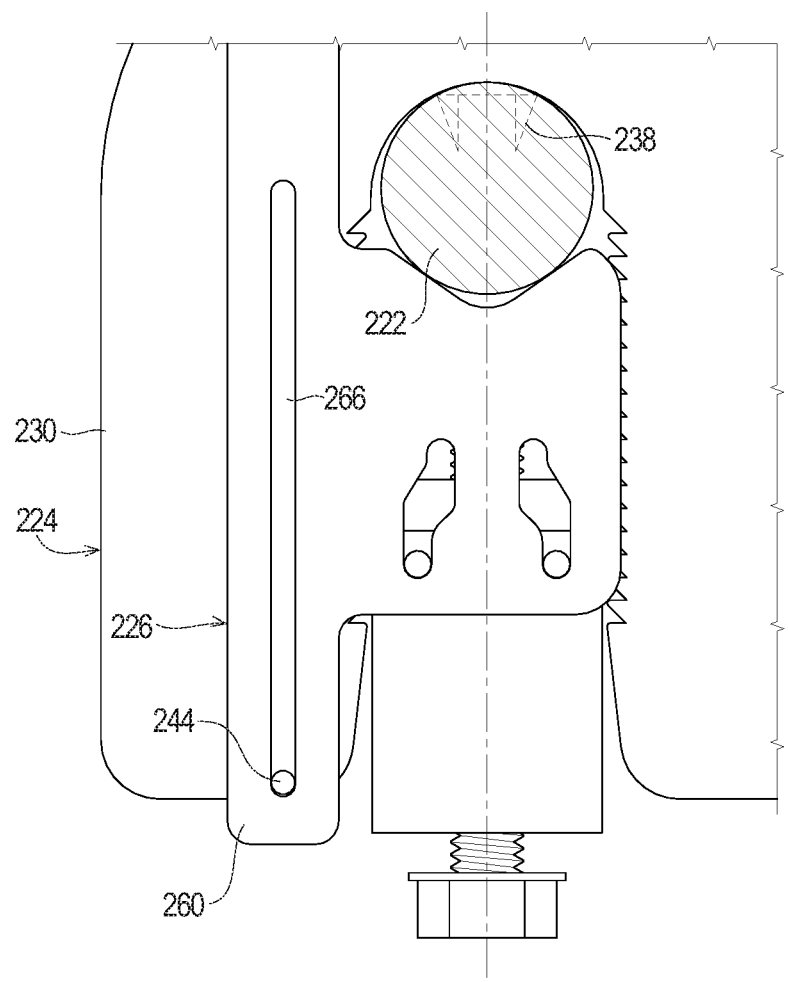
FIG. 16 is a a is a top plan view illustrating the second example sensor clamp of the present invention in an assembled, clamped configuration.

The example sensor clamp system 220 including the example base assembly 224 and example carriage assembly 226 is reconfigurable from a disassembled configuration as shown in FIGS. 11 and 12, to an assembled, open configuration as shown in FIG. 13, to an assembled, open configuration as shown in FIG. 14, to an assembled, pre-clamped configuration as shown in FIG. 15, and to an assembled, clamped configuration as shown in FIG. 16.

In the assembled, open configuration, the carriage assembly 226 is detachably attached to the base assembly 224 by arranging first and second plate projections 244 and 246 within the channel slots 266 of the guide plates 260 and 262, respectively. In the assembled, open configuration, the slot axis S is angled with respect to the housing axis B; in the example assembled, open configuration shown in FIG. 13, the slot axis S extends at substantially a right angle to the housing axis B.

In the assembled, open configuration, the example sensor clamp system 220 may be arranged such that the cable 222 is within the base notch 232 adjacent to the prong member 238 as shown in FIG. 13.

The first and second plate projections 244 and 246 engage the channel slots 266 such that the carriage assembly 226 may be rotated and linearly displaced relative to the base assembly 224. By first rotating the carriage assembly 226 relative to the base assembly 224, the slot axis S may be substantially aligned with the housing axis B. By next linearly displacing the carriage assembly 226 along the housing axis B relative to the base assembly 224, the example sensor clamp system 220 may be placed into the assembled, closed configuration as shown in FIG. 14. Further displacement of the carriage assembly 226 along the base axis B places the example sensor clamp 220 into the assembled, pre-clamped configuration as shown in FIG. 15. The example first and second guide plates 260 and 262 engage the first and second housing surfaces 240 and 242, respectively, to restrict movement of the carriage assembly 226 to only along the housing axis B when the example sensor clamp system 220 is reconfigured from the assembled, closed configuration to the assembled, pre-clamped configuration.

The example carriage assembly 226 is thus supported within the base notch 232 of the example base assembly 224 for movement towards and away from the prong member 238. As described above with respect to the example carriage assembly 26, the carriage assembly 226 is arranged within the base notch 232 such that the brace teeth 254 on the first and second brace members 252 and 254 face the first and second sets of base teeth 234 and 236, respectively. The example carriage assembly 226 is further reconfigurable between a retracted configuration in which first and second sets of brace teeth 254 do not engage base teeth 234 and 236 and an extended configuration in which the first and second sets of brace teeth 254 engage the base teeth 234 and 236 as generally described above.

When the brace teeth 234 and 236 engage the base teeth 254, the position of the anchor member 250 is fixed relative to the base housing 230. With the anchor member 250 fixed relative to the base housing, axial rotation of a clamp bolt 280 forces an engaging member 282 of the carriage assembly 226 towards the closed end of the base notch 232. In the example sensor clamp system 220, the engaging member 282 is forced towards the prong member 238. When the clamp bolt 280 is fully tightened, the example sensor clamp system 220 is in the assembled, clamped configuration. When the example sensor clamp system 220 is in the assembled, clamped configuration, the example prong member 238 penetrates the cable 222 to establish a direct physical connection between the prong member 238 and the interior of the cable 222 (e.g., electric conductors).

The example base assembly 224 and carriage assembly 226 are constructed and interoperate in the same manner as the example base assembly 24 and carriage assembly 26 described above. The details of the construction and interoperation of the example base assembly 224 and carriage assembly 226 will not be described again herein in detail with the understanding that the discussion of the example base assembly 24 and carriage assembly 26 may be applied to the example base assembly 224 and carriage assembly 226.

What is claimed is:

1. A clamp assembly for use with a cable of an electrical distribution system comprising:
    a base housing defining at least one set of base teeth and a base axis;
    an anchor member defining a threaded bore, where the anchor member is supported for movement relative to the base housing along the base axis;
    at least one brace member defining at least one set of brace teeth, where the anchor member supports the at least one brace member for movement along a direction lateral to the base axis between a retracted position and an extended position;
    an engaging member; and
    a clamp bolt that engages the threaded bore; wherein
    when the at least one brace member is in the retracted position relative to the anchor member, the at least one set of brace teeth is spaced from and does not engage the at least one set of base teeth;

when the at least one brace member is in the extended position relative to the anchor member, the at least one set of brace teeth engages the at least one set of base teeth to brace the at least one brace member against the base housing; and when the at least one brace member is braced against the base housing, axial rotation of the clamp bolt applies a clamp force on the engaging member to clamp the cable between the engaging member and the base housing;

at least one guide plate is secured relative to the anchor member;

the at least one guide plate defines at least one guide slot;

the at least one brace member defines a guide projection; and the guide slot engages the guide projection such that
movement of the at least one brace member relative to the anchor member is limited to between first and second end positions,
the at least one brace member is in the retracted position when the at least one brace member is at the first end position, and
the at least one brace member is in the extended position when the at least one brace member is at the second end position.

2. A clamp assembly as recited in claim 1, further comprising at least one biasing member arranged to bias the at least one brace member out of the retracted position and towards the extended position.

3. A clamp assembly as recited in claim 1, in which:
the base housing defines first and second sets of base teeth;
first and second brace members define first and second sets of brace teeth, respectively;
when the first and second brace members are in first and second retracted positions, respectively, the first and second sets of brace teeth are disengaged from the first and second sets of base teeth, respectively; and
when the first and second brace members are in first and second extended positions, respectively, the first and second sets of brace teeth engage the first and second sets of base teeth, respectively, to brace the first and second brace members against the base housing.

4. A clamp assembly as recited in claim 3, further comprising first and second biasing members arranged to bias the first and second brace members out of the first and second retracted positions and into the first and second extended positions, respectively.

5. A clamp assembly as recited in claim 1, further comprising a prong member supported by the base housing to engage the cable when the engaging member clamps the cable between the engaging member and the base housing.

6. A clamp assembly as recited in claim 1, in which the at least one guide slot is shaped to hold the at least one brace member in the retracted position as the anchor member is moved relative to the base housing and to allow the at least one brace member to move into the retracted position when the clamp bolt is rotated to apply the clamp force on the engaging member.

7. A clamp assembly as recited in claim 1, in which:
the at least one guide plate defines first and second guide slots;
the first and second brace members define a-first and second guide projections, respectively; and
the first and second guide slots engage the first and second guide projections such that
movement of the first and second brace members relative to the anchor member is limited to between first and second end positions,
the at least one brace member is in the retracted position when the at least one brace member is at the first end position, and
the at least one brace member is in the extended position when the at least one brace member is at the second end position.

8. A clamp assembly as recited in claim 7, in which the first and second guide slots are shaped to hold the first and second brace members in the retracted position as the anchor member is moved relative to the base housing and to hold the first and second brace members in the extended position as the clamp bolt is rotated to apply the clamp force on the engaging member.

9. A clamp assembly as recited in claim 1, in which:
the at least one guide plate defines at least one channel slot;
the base housing defines at least one plate projection; and
the at least one channel slot engages the at least one plate projection such that
movement of the at least one anchor member relative to the base housing is limited to between first and second end positions,
the at least one brace member is in the retracted position when the at least one brace member is at the first end position, and
the at least one brace member is in the extended position when the at least one brace member is at the second end position.

10. A clamp assembly for use with a cable of an electrical distribution system comprising:
a base housing defining first and second sets of base teeth and a base axis;
an anchor member defining a threaded bore, where the anchor member is supported for movement relative to along the base axis;
first and second brace members defining first and second sets of teeth, respectively, where the anchor member supports the first and second brace members for movement along a direction lateral to the base axis;
first and second biasing members arranged to bias the first and second brace members into first and second extended positions, respectively;
an engaging member; and
a clamp bolt that engages the threaded bore; wherein
when the first and second brace members are in first and second extended positions, respectively, the first and second sets of brace teeth engage the first and second sets of base teeth, respectively, to brace the first and second brace members against the base housing; and
when the first and second brace members are braced against the base housing, axial rotation of the clamp bolt applies a clamp force on the engaging member to clamp the cable between the engaging member and the base housing.

11. A clamp assembly as recited in claim 10, further comprising a prong member supported by the base housing to engage the cable when the engaging member clamps the cable between the engaging member and the base housing.

12. A clamp assembly as recited in claim 10, in which:
at least one guide plate is secured relative to the anchor member;
the at least one guide plate defines at least one guide slot;
the first and second brace members define a guide projection; and the guide slot engages the guide projection to limit movement of the first and second brace members relative to the anchor member.

13. A clamp assembly as recited in claim 12, in which the at least one guide slot is shaped to hold the first and second brace members in the retracted position as the anchor member is moved relative to the base housing and to allow the at least one brace member to move into the retracted position as the clamp bolt is rotated to apply the clamp force on the engaging member.

14. A clamp assembly as recited in claim 10, in which:
at least one guide plate is secured relative to the anchor member;
the at least one guide plate defines first and second guide slots;
the first and second brace members define a first and second guide projections, respectively; and
the first and second guide slots engage the first and second guide projections to limit movement of the first and second brace members relative to the anchor member.

15. A clamp assembly as recited in claim 14, in which the first and second guide slots are shaped to hold the at least one brace member in the retracted position as the anchor member is moved relative to the base housing and to allow the at least one brace member to move into the retracted position as the clamp bolt is rotated to apply the clamp force on the engaging member.

16. A clamp assembly for use with a cable of an electrical distribution system comprising:
a base housing defining at least one set of base teeth and a base axis;
an anchor member defining a threaded bore, where the anchor member is supported for movement relative to along the base axis;
at least one brace member defining at least one set of brace teeth, where the anchor member supports the at least one brace member for movement along a direction lateral to the base axis;
an engaging member; and
a clamp bolt that engages the threaded bore; wherein
when the at least one brace member is in an extended position, the at least one set of brace teeth engages the at least one set of base teeth to brace the at least one brace member against the base housing; and
when the at least one brace member is braced against the base housing, axial rotation of the clamp bolt applies a clamp force on the engaging member to clamp the cable between the engaging member and the base housing;
at least one guide plate is secured relative to the anchor member;
the at least one guide plate defines at least one guide slot;
the at least one brace member defines a guide projection; and
the guide slot engages the guide projection to limit movement of the at least one brace member relative to the anchor member.

17. A clamp assembly as recited in claim 16, further comprising at least one biasing member arranged to bias the at least one brace member towards the extended position.

18. A clamp assembly as recited in claim 16, in which the at least one guide slot is shaped to hold the at least one brace member in the retracted position as the anchor member is moved relative to the base housing and to allow the at least one brace member to move into the retracted position as the clamp bolt is rotated to apply the clamp force on the engaging member.

19. A clamp assembly as recited in claim 16, in which:
the at least one guide plate defines first and second guide slots;
the first and second brace members define a first and second guide projections, respectively; and
the first and second guide slots engage the first and second guide projections to limit movement of the first and second brace members relative to the anchor member.

20. A clamp assembly as recited in claim 19, in which the first and second guide slots are shaped to hold the at least one brace member in the retracted position as the anchor member is moved relative to the base housing and to allow the at least one brace member to move into the retracted position as the clamp bolt is rotated to apply the clamp force on the engaging member.

21. A clamp assembly for use with a cable of an electrical distribution system comprising:
a base housing defining at least one set of base teeth and a base axis;
an anchor member defining a threaded bore, where the anchor member is supported for movement relative to along the base axis;
at least one brace member defining at least one set of brace teeth, where the anchor member supports the at least one brace member for movement along a direction lateral to the base axis;
an engaging member; and
a clamp bolt that engages the threaded bore; wherein
when the at least one brace member is in an extended position, the at least one set of brace teeth engages the at least one set of base teeth to brace the at least one brace member against the base housing;
when the at least one brace member is braced against the base housing, axial rotation of the clamp bolt applies a clamp force on the engaging member to clamp the cable between the engaging member and the base housing;
at least one guide plate is secured relative to the anchor member;
the at least one guide plate defines first and second guide slots;
the first and second brace members define a first and second guide projections, respectively; and
the first and second guide slots engage the first and second guide projections to limit movement of the first and second brace members relative to the anchor member.

22. A clamp assembly as recited in claim 21, further comprising at least one biasing member arranged to bias the at least one brace member towards the extended position.

23. A clamp assembly as recited in claim 21, in which the guide slot is shaped to hold the at least one brace member in the retracted position as the anchor member is moved relative to the base housing and to allow the at least one brace member to move into the retracted position as the clamp bolt is rotated to apply the clamp force on the engaging member.

* * * * *